United States Patent
Zejda

Patent Number: 5,480,530
Date of Patent: Jan. 2, 1996

[54] MASK FOR COVERING THE MARGIN OF A DISK-SHAPED SUBSTRATE

[75] Inventor: Jaroslav Zejda, Rodenbach, Germany

[73] Assignee: Leybold Aktiengesellschaft, Hanau, Germany

[21] Appl. No.: 164,009

[22] Filed: Dec. 8, 1993

[30] Foreign Application Priority Data

Mar. 9, 1993 [DE] Germany .......................... 43 07 382.4

[51] Int. Cl.⁶ .............................. C23C 14/34; C23C 16/04
[52] U.S. Cl. ..................... 204/298.11; 118/504; 118/505; 118/720; 118/721
[58] Field of Search ..................... 118/500, 504, 118/505, 721, 728; 204/298.11, 720

[56] References Cited

U.S. PATENT DOCUMENTS

| | | | |
|---|---|---|---|
| 4,473,455 | 9/1984 | Dean et al. | 118/728 |
| 4,556,968 | 12/1985 | Pelkey et al. | 369/287 |
| 4,634,512 | 1/1987 | Allen et al. | 118/500 |
| 5,003,530 | 3/1991 | Yamamori | 369/289 |
| 5,089,110 | 2/1992 | Allen et al. | 118/500 |

FOREIGN PATENT DOCUMENTS

| | | | |
|---|---|---|---|
| 0229914 | 11/1987 | European Pat. Off. | |
| 0390564 | 3/1990 | European Pat. Off. | |
| 0392516 | 4/1990 | European Pat. Off. | |
| 3340535 | 5/1984 | Germany. | |
| 3604698 | 8/1987 | Germany. | |
| 8914219 | 2/1990 | Germany. | |
| 9206635 | 9/1992 | Germany. | |
| 2-85366 | 3/1990 | Japan | 204/298.11 |
| 9110233 | 7/1991 | WIPO. | |

*Primary Examiner*—R. Bruce Breneman
*Assistant Examiner*—Rodney G. McDonald
*Attorney, Agent, or Firm*—Felfe & Lynch

[57] ABSTRACT

In a mask (7) for covering the outer marginal area of a disk-shaped substrate surface during a coating process, for example a vacuum sputtering or vapor depositing process, the mask (7) is made of an elastic material in the form of a planar plate with an essentially circular opening. To center and lock it onto the substrate (1) an inwardly extending annular flange is provided which assumes the actual masking function and extends in a plane parallel to the plane of the plate. The substrate (1) is laid on this flange and retained by projections extending radially inward. Prior to positioning the substrate it is bowed axially to spread apart the projections.

5 Claims, 3 Drawing Sheets

MASK FOR COVERING THE MARGIN OF A DISK-SHAPED SUBSTRATE

BACKGROUND OF THE INVENTION

The invention relates to a mask for covering the outer margin of a disk-shaped substrate surface during a coating process, such as a sputtering or vapor-coating process in a vacuum.

Machine-readable data storage devices for a great variety of applications are gaining in importance. Depending on the use and the required data storage device density, a distinction is made of magnetic, magneto-optical and optical data storage devices, such as hard disks, floppy disks, magnetic tape and CD's. All data storage devices have it in common that at the midpoint of their manufacture is a vacuum process for the application of technical coatings.

What is involved essentially in the present invention is the manufacture of magneto-optical and optical data storage devices. As the base for these storage devices disk-shaped substrates of plastic, such as polycarbonate (PC) or polymethyl methacrylate (PMMA), are used. During the application of the data storage coatings to these substrates, areas of the substrate surface are masked off. As a rule, masks for this purpose are used which mask off the inner and/or outer area of the substrate surface. These masks are often disposed so as to be stationary in front of the particular coating sources. The substrates to be coated are placed on these stationary masks by a handling system.

The diameters of the disk-shaped substrates are standardized and are substantially between 80 and 300 mm. A new generation of data storage devices is characterized by diameters that are smaller than 80 mm. This reduction of the diameter necessarily results in a reduction of the storage surface available on the substrate. The manufacturers of such data storage devices try to make optimum use of the usable storage area. They therefore strive to make the masked areas as small as possible and to minimize the coaxiality tolerances, especially of the outside mask.

Coating apparatus with a plurality of stations constitute a special problem. If the substrates are coated successively in many stations, and the user permits only a very small eccentricity of the inside and outside masking, then it is often impossible to achieve this with permanently built-in, stationary mask systems.

SUMMARY OF THE INVENTION

The invention relates to a mask for masking off the outer and inner peripheries of a disk-shaped substrate having a central hole, such as a compact disk (CD). The mask is disposed on the disk so as to be stationary while the substrate is exposed to a coating source.

The mask comprises a flat plate having an essentially circular opening defined by an inwardly facing cylindrical wall with a diameter substantially the same as the diameter of the substrate. An annular flange extends radially inward from the cylindrical wall in order to mask the outer periphery of the substrate. A plurality of first projections extend inward from the wall at a distance from the flange corresponding to the thickness of the substrate. The projections are movable apart to receive the substrate as illustrated in FIG. 4.

The mask further comprises a hollow cylindrical portion having an outwardly facing cylindrical wall with a diameter substantially the same as the inside diameter of the hole in the substrate. An annular flange extends outward in order to mask the inner periphery of the disk, and a plurality of resiliently movable second projections are spaced at a distance from the flange corresponding to the thickness of the substrate.

DETAILED DESCRIPTION OF THE PREFERRED EMBODIMENT

Figure 1:
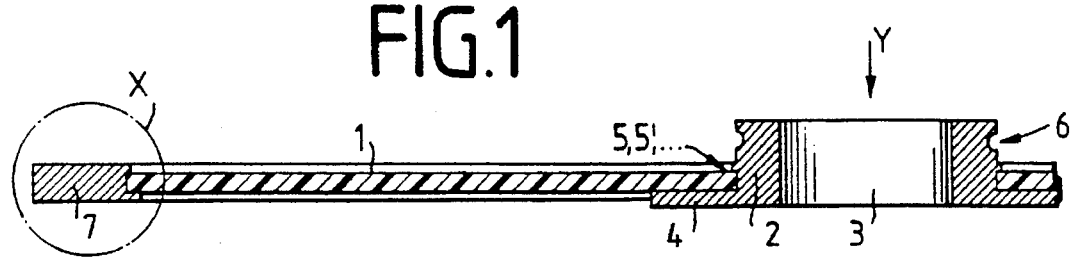
FIG. 1 is a fragmentary cross section of a substrate with a central substrate holder and the mask in accordance with the invention.
Figure 6:
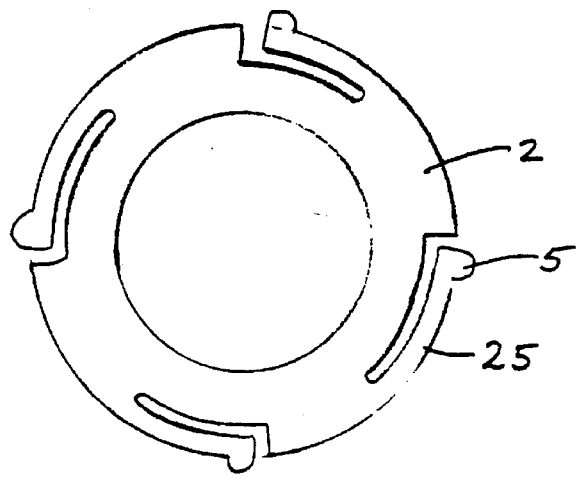
FIG. 6 is a plan view of the central substrate holder showing the resiliently arranged detents.

A flat, disk-shaped substrate 1 (FIG. 1) ready to be coated has a central hole into which a hollow cylindrical substrate holder 2 is inserted. The latter is provided with an axial bore 3 as well as an annular seat 4 on its bottom. The substrate 1 is placed axially onto the substrate holder 2 over the second projections detents 5 until it lies upon the seat 4. As shown in FIG. 6, the detents 5 may be made resilient by provision of spring arms 25. Also on the substrate holder 2 an annular groove 6 is provided which is engaged by a handling system, not shown, for retention and transport.

The substrate 1 is surrounded by an annular mask 7 with a circular opening 14, which has an approximately rectangular profile in its sectional representation. The entire assembly of substrate 1, substrate holder 2 and mask 7 is put into a vacuum chamber through an airlock. The embodiment represented in FIG. 1 has both an annular inside and an annular outside masking which is achieved by seat 4 and a special configuration of the front side of mask 7.

Figure 2:
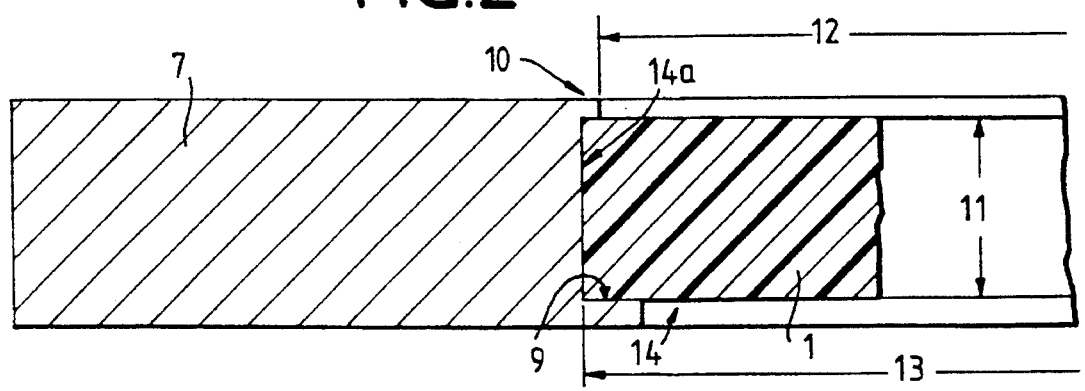
FIG. 2 is an enlarged representation of the detail X of FIG. 1.

Both the holder 2 and the mask 7 are preferably made of an elastic material such as plastic in order to provide resiliency. Suitable plastics are polycarbonate and PMMA. Referring to FIG. 2, the inwardly facing cylindrical wall 14a of the opening 14 is against the outer circumference of substrate 1 virtually without radial clearance. An annular flange 9 extends radially inward from the cylindrical wall 14a and presents an annular surface onto which the substrate 1 is placed and which performs the actual masking function.

Figure 3:
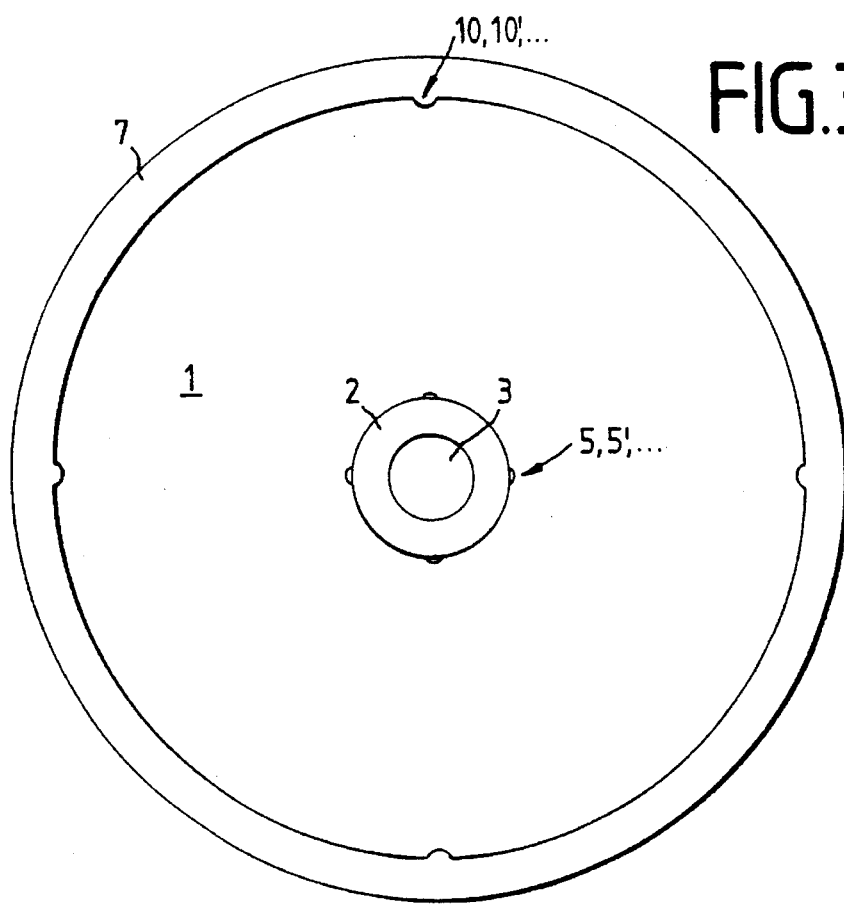
FIG. 3 is a reduced plan view of the substrate holder, the substrate and the mask seen in direction Y of FIG. 1.

Referring to FIG. 3, the mask 7 is provided on its upper side with a plurality of first projections 10 for the precise locking of substrate 1 in the mask 7. The distance 11 between the between the upper surface 9 and the projection 10 corresponds to the substrate thickness.

The diametric distance 12 between the projections 10 is made slightly smaller than the substrate diameter 13.

Figure 4:
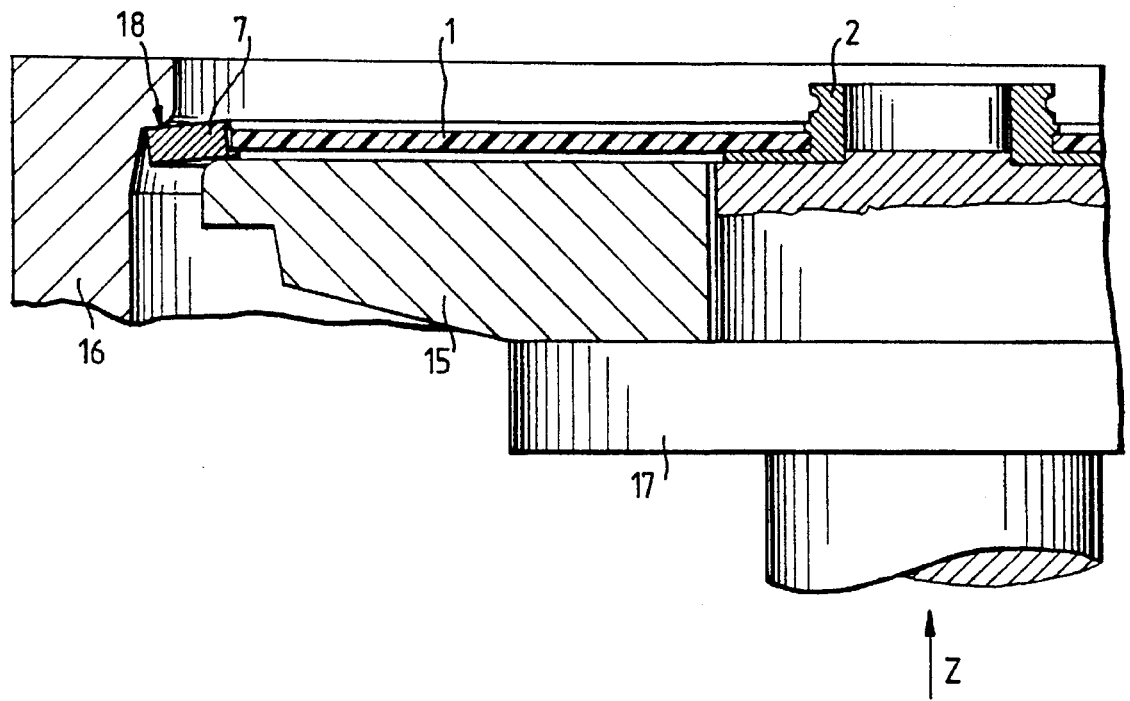
FIG. 4 is a fragmentary cross section of the substrate of FIG. 1 with a bending device for mounting the mask.

Referring to FIG. 4, a flexing device is used to set the substrate 1 into the mask 7. This consists essentially of a central presser 15 and an annular anvil 16.

The mask 7 is first placed on the presser 15 which is moved axially in direction Z by means of the pusher 17 until the mask contacts an abutment 18 of the stationary anvil 16. As soon as the mask 7 contacts the abutment 18 the presser 15 is raised in direction Z until the mask bows axially so that the diametric distance 12 (FIG. 2) is just larger than the substrate diameter 13. Then the substrate mounted with the substrate holder 2 is set into the mask 7 by moving the pusher 17 in the opposite direction.

Figure 5:
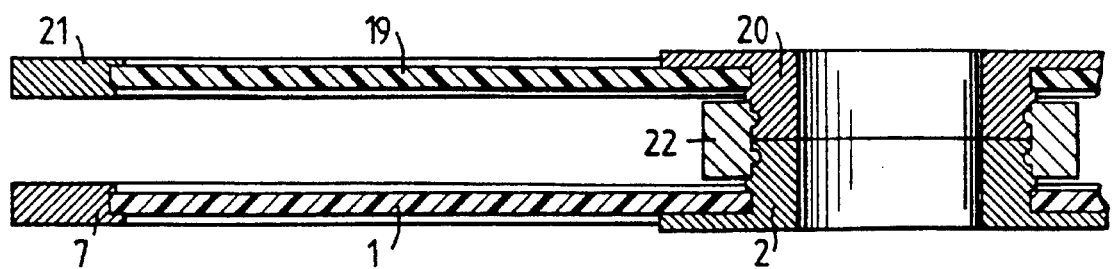
FIG. 5 is a fragmentary cross section of two masks back-to-back.

A special arrangement of two substrates 1, 19 for coating them on one side is represented in FIG. 5. For this purpose an identical arrangement, consisting of substrate 19, substrate holder 20 and a mask 21 are placed in mirror-image symmetry on the back of the embodiment of FIG. 1. The two substrate holders 2 and 20 are affixed by a locking ring 22. This back-to-back arrangement of substrates 1 and 19 permits coating the oppositely facing front surfaces of both substrates in one operation.

Figure 7:
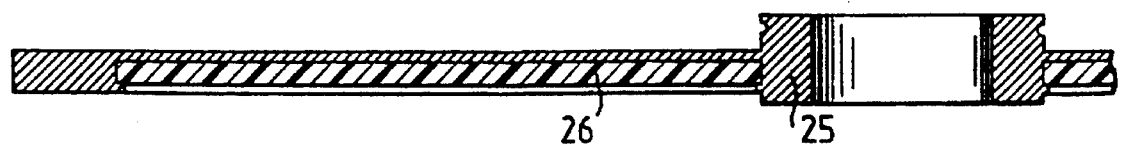
FIG. 7 is a fragmentary cross section of a one-piece type of mask and substrate holder.

In the embodiment of FIG. 7, the substrate holder 25 is in one piece with an integrated outer mask for accommodating a substrate 26. In this arrangement, as in the other embodiments, the substrate's front surface faces downward for coating.

I claim:

1. A mask for processing a disk shaped substrate having a thickness, an annular marginal portion defining an outside diameter of said substrate, and a central circular hole defining an inside diameter of said substrate, said mask comprising a flat plate having an essentially circular opening defined by an inwardly facing cylindrical wall with a diameter substantially the same as the outside diameter of said substrate, an annular flange extending radially inward from said cylindrical wall, and a plurality of first projections extending inward from said wall about said opening and being movable radially apart, said first projections being spaced from said flange by a distance substantially the same as the thickness of said substrate, said first projections being sized to receive said substrate therebetween when moved apart, and a hollow cylindrical portion having an outwardly facing cylindrical wall with a diameter substantially the same as the inside diameter of the hole in said substrate, an annular flange extending outward from said outwardly facing wall, and second projections extending outward from said outwardly facing wall, said second projections being spaced from said outward extending annular flange by a distance substantially the same as the thickness of said substrate, said second projections being mounted for inward resilient movement.

2. Mask as in claim 1 wherein said flat plate is made of elastic material so that said first projections can be moved radially apart by bowing said plate axially.

3. Mask as in claim 1 wherein said flat plate is an annular plate having an outwardly facing cylindrical wall concentric to said inwardly facing cylindrical wall.

4. Mask as in claim 1 wherein said first and second projections are rounded nubs.

5. A masked substrate for processing, comprising a disk shaped substrate having a thickness, an outside diameter, and a central circular hole defining an inside diameter, a flat plate having an essentially circular opening defined by an inwardly facing cylindrical wall with a diameter substantially the same as the outside diameter of said substrate, an annular flange extending radially inward from said cylindrical wall, and a plurality of first projections extending inward from said wall about said opening and being movable radially apart, said first projections being spaced from said flange by a distance substantially the same as the thickness of said substrate, said outside diameter of said substrate being received between said flange and said first projections of said flat plate, and a hollow cylindrical portion having an outwardly facing cylindrical wall with a diameter substantially the same as the inside diameter of the hole in said substrate, an annular flange extending outward from said outward facing wall, and second projections extending outward from said outwardly facing wall and movable radially inward, said second projections of said cylindrical portion being spaced from said outwardly extending annular flange of said cylindrical portion by a distance substantially the same as the thickness of said substrate, said inside diameter of said substrate being received between said flange and said second projections of said hollow cylindrical portion.

\* \* \* \* \*